US010096641B2

(12) United States Patent
Ikeda et al.

(10) Patent No.: US 10,096,641 B2
(45) Date of Patent: Oct. 9, 2018

(54) CMOS IMAGE SENSOR

(71) Applicant: KABUSHIKI KAISHA TOSHIBA, Tokyo (JP)

(72) Inventors: Keiji Ikeda, Tokyo (JP); Tsutomu Tezuka, Ibaraki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 132 days.

(21) Appl. No.: 15/066,737

(22) Filed: Mar. 10, 2016

(65) Prior Publication Data
US 2016/0197116 A1 Jul. 7, 2016

Related U.S. Application Data

(63) Continuation of application No. PCT/JP2015/055632, filed on Feb. 26, 2015.

(30) Foreign Application Priority Data

Feb. 27, 2014 (JP) .................. 2014-037374

(51) Int. Cl.
*H01L 27/146* (2006.01)
*H01L 31/028* (2006.01)

(52) U.S. Cl.
CPC .. *H01L 27/14643* (2013.01); *H01L 27/14614* (2013.01); *H01L 27/14616* (2013.01);
(Continued)

(58) Field of Classification Search
CPC ......... H01L 27/14643; H01L 27/14616; H01L 31/0312; H01L 31/074; H01L 29/7849; H01L 29/785; H01L 2/146147
See application file for complete search history.

(56) References Cited

U.S. PATENT DOCUMENTS

| 8,168,509 B2 * | 5/2012 | Ko .................... H01L 27/14689 257/E21.568 |
| 2002/0000573 A1 | 1/2002 | Higuchi et al. |

(Continued)

FOREIGN PATENT DOCUMENTS

| EP | 2 701 198 | 2/2014 |
| JP | 2001-244419 | 9/2001 |

(Continued)

OTHER PUBLICATIONS

Gupta et al. "7-nm FinFET CMOS Design Enabled by Stress Engineering Using Si, Ge, and Sn," IEEE Transactions on Electron Devices, vol. 61, No. 5, May 2014, pp. 1222-1230.*

(Continued)

*Primary Examiner* — Matthew Reames
*Assistant Examiner* — John Bodnar
(74) *Attorney, Agent, or Firm* — Finnegan, Henderson, Farabow, Garrett & Dunner, L.L.P.

(57) ABSTRACT

According to one embodiment, a CMOS image sensor includes a photoelectric conversion element and an amplifier transistor. The photoelectric conversion element converts incident light into an electric signal. The amplifier transistor has a heterojunction in which a Ge layer and an SiGeSn layer are joined together, as a channel region and amplifies the electric signal resulting from conversion by the photoelectric conversion element.

10 Claims, 8 Drawing Sheets

(52) U.S. Cl.
CPC ...... *H01L 31/028* (2013.01); *H01L 27/14632* (2013.01); *H01L 27/14634* (2013.01); *H01L 27/14649* (2013.01)

(56) References Cited

U.S. PATENT DOCUMENTS

| | | | | |
|---|---|---|---|---|
| 2008/0099806 A1* | 5/2008 | Kang | ................ | H01L 27/14609 257/292 |
| 2010/0026865 A1* | 2/2010 | Tivarus | ............ | H01L 27/14641 348/308 |
| 2012/0171832 A1* | 7/2012 | Toh | ................... | H01L 29/66795 438/300 |
| 2013/0020662 A1* | 1/2013 | Kao | ................. | H01L 27/14632 257/431 |

FOREIGN PATENT DOCUMENTS

| | | |
|---|---|---|
| JP | 2009-514248 | 4/2009 |
| JP | 2009-147056 | 7/2009 |
| JP | 2010-171337 | 8/2010 |
| JP | 2011-146441 | 7/2011 |
| JP | 2013-232471 | 11/2013 |
| JP | 2014-236183 | 12/2014 |
| WO | WO 2014/026304 | 2/2014 |

OTHER PUBLICATIONS

English-language International Preliminary Report on Patentability from the International Bureau of WIPO for International Application No. PCT/JP2015/055632, dated Aug. 30, 2016.
Written Opinion of the International Searching Authority from the Japanese Patent Office for International Application No. PCT/JP2015/055532, dated Apr. 28, 2015.
Kohara et al.; "A CMOS Image Sensor With 2.5-e$^-$ Random Noise and 110-ke$^-$ Full Well Capacity Using Column Source Follower Readout Circuits", Symposium on VLSI Circuits, pp. 182-183, (2009).
Xie et al.; "Synthesis, Stability Range, and Fundamental Properties of Si—Ge—Sn Semiconductors Grown Directly on Si(100) and Ge(100) Platforms", Chem. Mater., vol. 22, No, 12, pp. 3779-3789, (2010).
English-language International Search Report from the Japanese Patent Office for International Application No. PCT/JP2015/055632, dated Apr. 28, 2015.

* cited by examiner

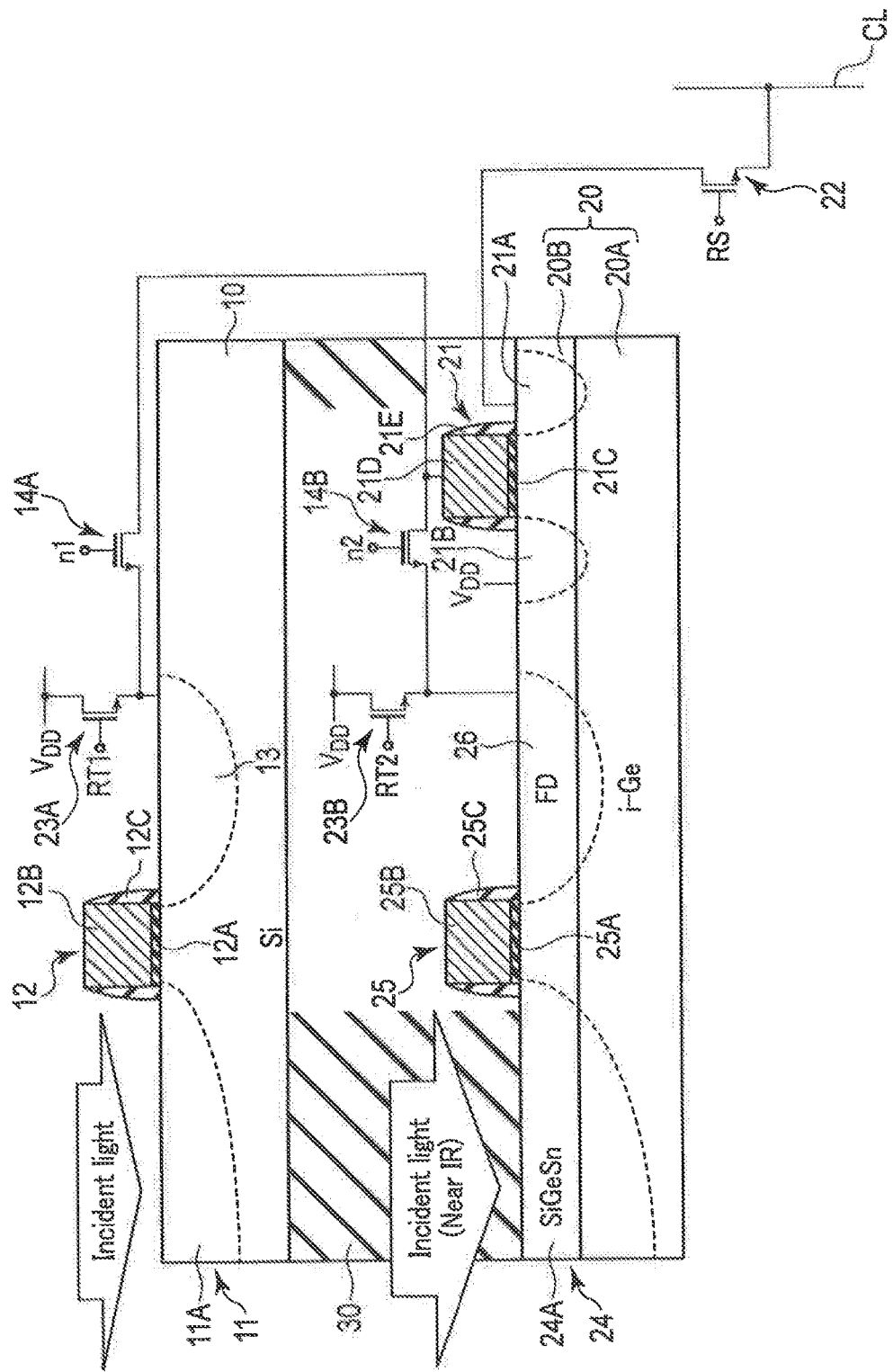
F I G. 10

CMOS IMAGE SENSOR

CROSS-REFERENCE TO RELATED APPLICATIONS

This application is a Continuation Application of PCT Application No. PCT/JP2015/055632, filed Feb. 26, 2015 and based upon and claiming the benefit of priority from Japanese Patent Application No. 2014-037374, filed Feb. 27, 2014, the entire contents of all of which are incorporated herein by reference.

FIELD

Embodiments of the present invention relate to a CMOS image sensor comprising a photoelectric conversion element.

BACKGROUND

For conventional image sensors including silicon substrates, noise in photodiodes and amplifier transistors formed on the same silicon substrate has been reduced, and a readout circuit has been improved to allow photon signals to be read out with low noise of 1 $e^-$rms.

For a further reduction in noise in CMOS image sensors and a significant increase in dynamic range, not only noise in the photodiode, but also noise in a transistor forming a source-follower amplifier needs to be reduced. Successful photoelectric conversion of pixel signals with readout noise of less than approximately 15 $e^-$rms enables achievement of an ultimate sensitivity with which a single photon signal is detected, that is, photon counting.

BRIEF DESCRIPTION OF THE DRAWING

FIG. 10 is a sectional view depicting a configuration of a CMOS image sensor in a modification.

DETAILED DESCRIPTION

Figure 1:
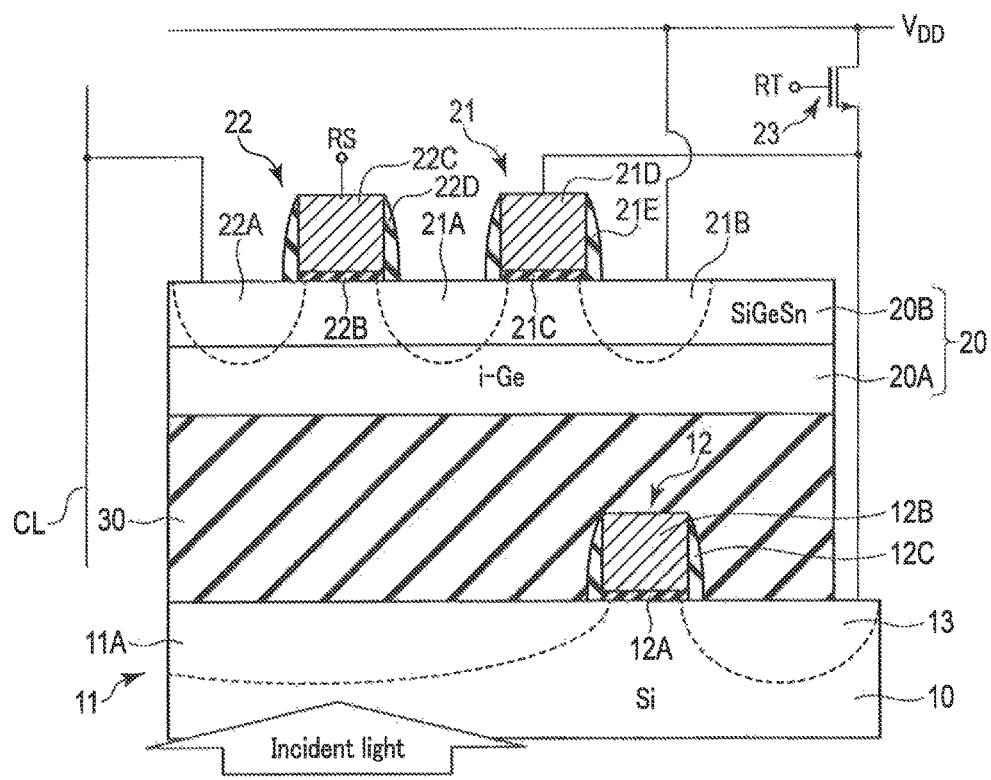
FIG. 1 is a sectional view depicting the structure of a CMOS image sensor in a first embodiment.

In general, according to one embodiment, a CMOS image sensor includes a photoelectric conversion element and an amplifier transistor. The photoelectric conversion element is configured to convert incident light into an electric signal. The amplifier transistor has a heterojunction in which a Ge layer and an SiGeSn layer are joined together, as a channel region and amplifies the electric signal resulting from conversion by the photoelectric conversion element.

Making a noise level equal to or lower than a current level is difficult for normal MOS field effect transistors (hereinafter referred to as Si-MOSFETs) that use an interface between an insulating film and a silicon substrate because of noise resulting from a phenomenon in which carriers are trapped and released by traps present at the insulating film interface and in the insulating film.

The present invention has been developed in order to solve the above-described problem. An object of the present invention is to provide a CMOS image sensor that enables a reduction in readout noise.

CMOS image sensors in embodiments will be described below with reference to the drawings. Components with the same functions and configurations are hereinafter denoted by the same reference numerals.

First Embodiment

A CMOS image sensor in a first embodiment will be described.

FIG. 1 is a sectional view depicting the structure of the CMOS image sensor in the first embodiment.

As depicted in FIG. 1, the CMOS image sensor includes a photoelectric conversion element, for example, a photodiode 11, a transfer gate transistor 12, and a floating diffusion 13 formed in a semiconductor substrate (for example, a p-type silicon substrate) 10, and an amplifier transistor 21, a select transistor 22, and a reset transistor 23 formed on an SiGeSn/Ge substrate 20.

The photodiode 11 includes a p-type silicon substrate 10 and an n-type diffusion layer 11A to convert light radiated through a second surface (or a back surface) opposite to a first surface (or a front surface) on which the transfer gate transistor 12 is arranged into an electric signal and to store the electric signal.

The transfer gate transistor 12 controls transfer of the electric signal stored in the n-type diffusion layer 11A to the floating diffusion 13. That is, the transfer gate transistor 12, when turned on, transfers the electric signal stored in the n-type diffusion layer 11A to the floating diffusion 13. The floating diffusion 13 stores the electric signal transferred by the transfer gate transistor 12 in order to convert the electric signal into a capacity signal (voltage signal).

The SiGeSn/Ge substrate 20 is a substrate comprising a germanium (Ge) substrate 20A on which an SiGeSn layer 20B is stacked. An interface between the Ge substrate 20A and the SiGeSn layer 20B includes a heterojunction. The SiGeSn layer is a mixed crystal of Si, Ge, and Sn, and is, for example, an $Si_xGe_{1-(x+y)}Sn_y$ layer (x=3.7y, and x>0, y>0). x+y is desirably approximately 0.37 or less than 0.37.

The amplifier transistor 21 includes the heterojunction between the Ge substrate 20A and the SiGeSn layer 20B as a channel region. The amplifier transistor 21 is a source-follower-connected transistor that amplifies a signal according to the capacity signal stored in the floating diffusion 13. The select transistor 22 controls the output of the signal amplified by the amplifier transistor 21. That is, the select transistor 22, when turned on, outputs the signal amplified by the amplifier transistor 21 to a column bus line CL.

The reset transistor 23 resets the electric signal stored in the floating diffusion 13. That is, the reset transistor 23, when turned on, supplies a power supply voltage VDD to the floating diffusion 13 to return the potential of the floating diffusion 13 to an initial state.

The structure of the CMOS image sensor in the first embodiment will be described in detail.

As depicted in FIG. 1, the n-type diffusion layer 11A is formed in the silicon substrate 10, and the silicon substrate 10 and the n-type diffusion layer 11A form the photodiode 11. Moreover, the floating diffusion 13 is formed in the silicon substrate 10 so as to be spaced from the n-type diffusion layer 11A. A gate insulating film 12A is formed on the silicon substrate 10 between the n-type diffusion layer 11A and the floating diffusion 13. A gate electrode 12B is formed on the gate insulating film 12A. The transfer gate transistor 12 includes the n-type diffusion layer 11A, the floating diffusion 13, the channel region (the silicon substrate 10 between the n-type diffusion layer 11A and the floating diffusion 13), the gate insulating film 12A, and the gate electrode 12B. Moreover, sidewall insulating films 12C are formed on side surfaces of the gate electrode 12B. The n-type diffusion layer 11A and the floating diffusion 13 serve as a source region or a drain region for the transfer gate transistor 12.

An interlayer insulating film 30 is formed on the transfer gate transistor 12 and the silicon substrate 10. On the interlayer insulating film 30, the SiGeSn/Ge substrate 20 is arranged in which a Ge substrate 20A and an SiGeSn layer 20B are stacked in order. An $Al_2O_3$ layer may be formed between the interlayer insulating film 30 and the SiGeSn/Ge substrate 20 as an adhesive layer that facilitates adhesion between the interlayer insulating film 30 and the SiGeSn/Ge substrate 20.

Furthermore, the amplifier transistor 21, the select transistor 22, and the reset transistor 23 are formed on the SiGeSn/Ge substrate 20.

The amplifier transistor 21 has the following structure. Diffusion layers 21A and 21B are formed in the SiGeSn layer 20B in the SiGeSn/Ge substrate 20 so as to be spaced from each other. The diffusion layers 21A and 21B serve as a source region or a drain region for the amplifier transistor 21. A gate insulating film 21C is formed between the diffusion layers 21A and 21B, and a gate electrode 21D is formed on the gate insulating film 21C. Moreover, sidewall insulating films 21E are formed on side surfaces of the gate electrode 21D. The gate electrode 21D is electrically connected to the floating diffusion 13. Moreover, the diffusion layer 21B is electrically connected to the power supply voltage VDD.

The select transistor 22 has the following structure. In the SiGeSn layer 20B in the SiGeSn/Ge substrate 20, a diffusion layer 22A is formed so as to be spaced from the diffusion layer 21A. The diffusion layer 22A serves as a source region or a drain region for the select transistor 22. The diffusion layer 21A serves as a drain region or a source region for the amplifier transistor 21 or the select transistor 22. A gate insulating film 22B is formed between the diffusion layers 22A and 21A, and a gate electrode 22C is formed on the gate insulating film 22B. Moreover, sidewall insulating films 22D are formed on side surfaces of the gate electrode 22C. A row select signal RS is supplied to the gate electrode 22C. Moreover, the source region 22A is electrically connected to the column bus line CL.

A reset signal RT is supplied to a gate of the reset transistor 23. A drain of the reset transistor 23 is electrically connected to the floating diffusion 13. A source of the reset transistor 23 is connected to the power supply voltage VDD.

Operations of the CMOS image sensor in the first embodiment will be described below.

Incident light radiated through the back surface of the silicon substrate 10 is received by the photodiode 11. The photodiode converts the incident light into an electric signal as an image of a visible area of the incident light and stores the electric signal. The electric signal stored in the photodiode 11 is converted into a capacity signal by the floating diffusion 13. Moreover, the capacity signal is converted into a voltage signal by the amplifier transistor 21, which uses the heterojunction of the SiGeSn/Ge substrate 20 as a channel region.

In this case, the heterojunction of the SiGeSn/Ge substrate 20 enables a high-quality quantum well structure to be formed without any defects resulting from lattice mismatch. Thus, compared to Si-MOSFETs that use the front surface of the silicon substrate as a channel, the amplifier transistor 21 uses the channel comprising the interface (heterojunction) between the SiGeSn layer 20B and the Ge substrate 20A to enable noise to be reduced by one or more orders of magnitude. Using the amplifier transistor 21 as described above enables photon counting with readout noise of less than approximately 0.15 e⁻rms, and a significant increase in dynamic range.

Subsequently, the voltage signal amplified by the amplifier transistor 21 is output to the column bus line CL via the select transistor 22. The select transistor 22 controls the output of the voltage signal to the column bus line CL.

The first embodiment includes a structure suitable for a back-illuminated CMOS image sensor in which light is radiated through the back surface of the semiconductor substrate 10 opposite to the front surface thereof on which the photodiode 11, the transistor 12, and the like are formed.

Figure 2A:
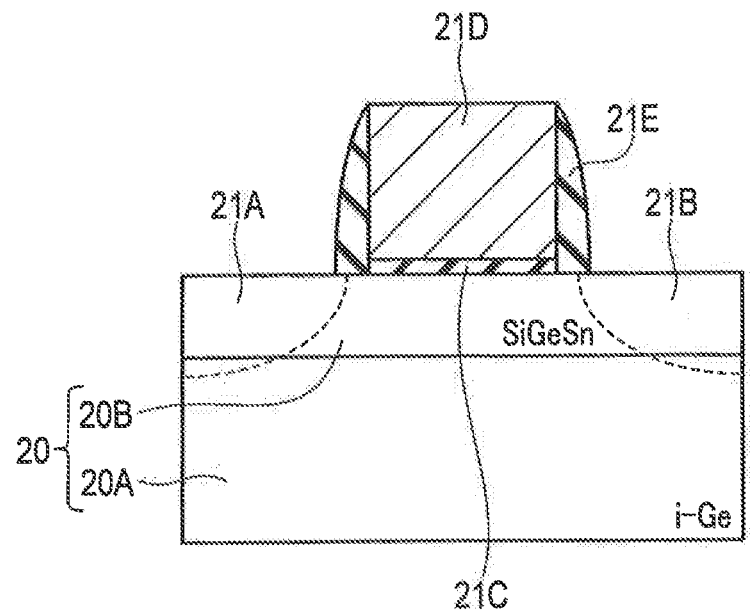
FIG. 2A is a sectional view of an amplifier transistor in the first embodiment.
Figure 2B:
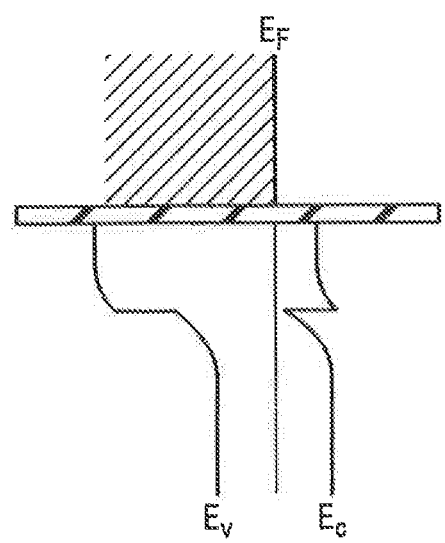
FIG. 2B is a band diagram of the amplifier transistor in the first embodiment.

Using FIG. 2A and FIG. 2B, a sectional structure of the amplifier transistor that uses the heterojunction of the SiGeSn/Ge substrate as a channel and a band diagram for the amplifier transistor will be described. FIG. 2A is a sectional view of the amplifier transistor. FIG. 2B is a band diagram for the amplifier transistor.

For the SiGeSn layer 20B, Ge forms a quantum well structure of Type 1. Moreover, a high-quality interface can be formed at the interface between the SiGeSn layer 20B and the Ge substrate 20A without any defects resulting from lattice mismatch. Therefore, as depicted in FIG. 2B, the interface between the SiGeSn layer 20B and the Ge substrate 20A has a smaller band gap than the front surface of the SiGeSn layer 20B. Thus, the channel of the amplifier transistor 21 is formed at the interface (heterojunction) between the SiGeSn layer 20B and the Ge substrate 20A. When the channel includes the interface between the SiGeSn layer 20B and the Ge substrate 20A, possible noise can be prevented which results from a phenomenon in which carriers are trapped and released by traps present at the gate insulating film interface and in the gate insulating film. Consequently, the amplifier transistor 21 enables noise to be reduced by one or more orders of magnitude compared to Si-MOSFETs.

Here, a condition for lattice match in the SiGeSn layer 20B in the SiGeSn/Ge substrate 20 is an $Si_xGe_{1-(x+y)}Sn_y$ layer (x=3.7y, x>0, y>0). The band gap in the SiGeSn layer is desirably large.

Figure 3:
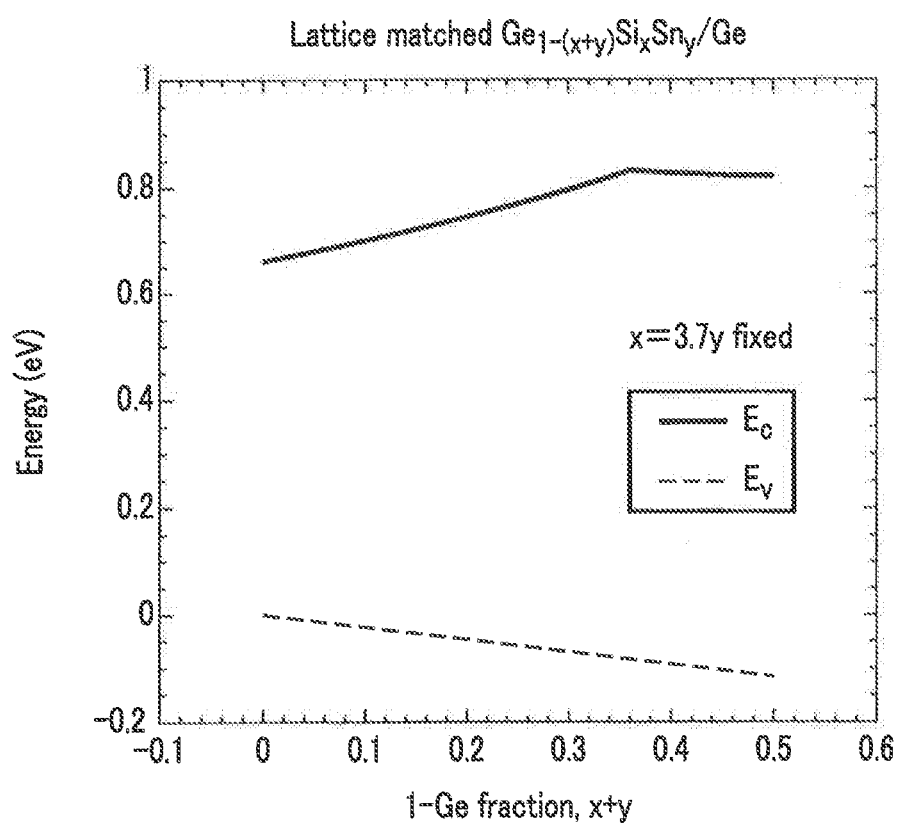
FIG. 3 is a diagram illustrating a relation between a band gap and compositions of Si and Sn in an SiGeSn layer in the first embodiment.

FIG. 3 is a diagram illustrating a relation between the band gap and compositions of Si and Sn in the SiGeSn layer. The horizontal axis indicates the compositions x+y of Si and Sn, and the vertical axis indicates the energy of the band gap. When x+y is 0, the band gap is 0.66 eV (the band gap of Ge). The band gap gradually increases as x+y increases from 0.

In this manner, the compositions of Ge and Sn are changed to enable the band gap in the SiGeSn layer 20B to be changed with the lattice match condition satisfied. As described above, the band gap in the SiGeSn layer 20B is desirably large.

Now, a method for manufacturing a CMOS image sensor in the first embodiment will be described using FIG. 1, FIG. 4, and FIG. 5.

Figure 4:
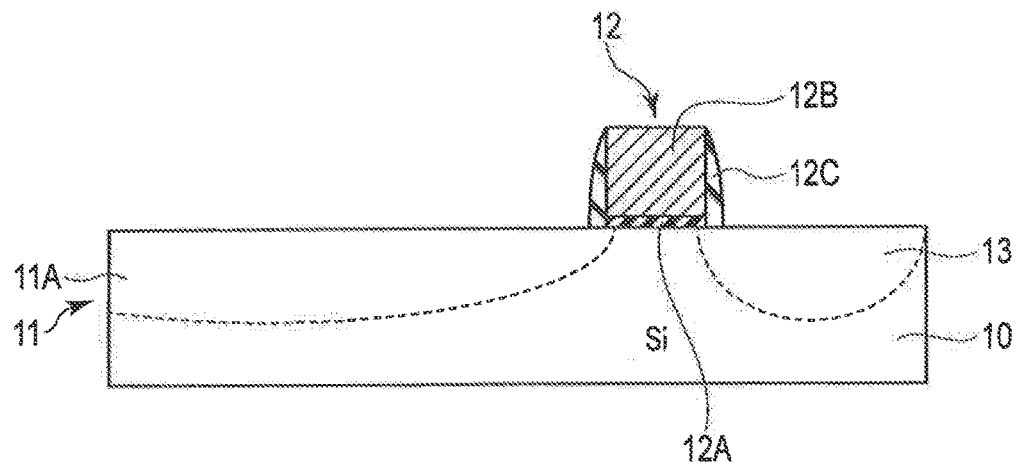
FIG. 4 is a sectional view illustrating a method for manufacturing a CMOS image sensor in the first embodiment.

First, as depicted in FIG. 4, the transfer gate transistor 12 is formed on the silicon substrate (for example, a p-type silicon semiconductor substrate) 10. That is, the gate insulating film 12A and the gate electrode 12B are formed on the silicon substrate 10. Moreover, the sidewall insulating films 12C are formed on the side surfaces of the gate electrode 12B. Subsequently, the n-type diffusion layer 11A, which forms the photodiode 11, and the floating diffusion (n-type diffusion layer) 13 are formed in the silicon substrate 10 on the respective opposite sides of the gate electrode 12B.

Figure 5:
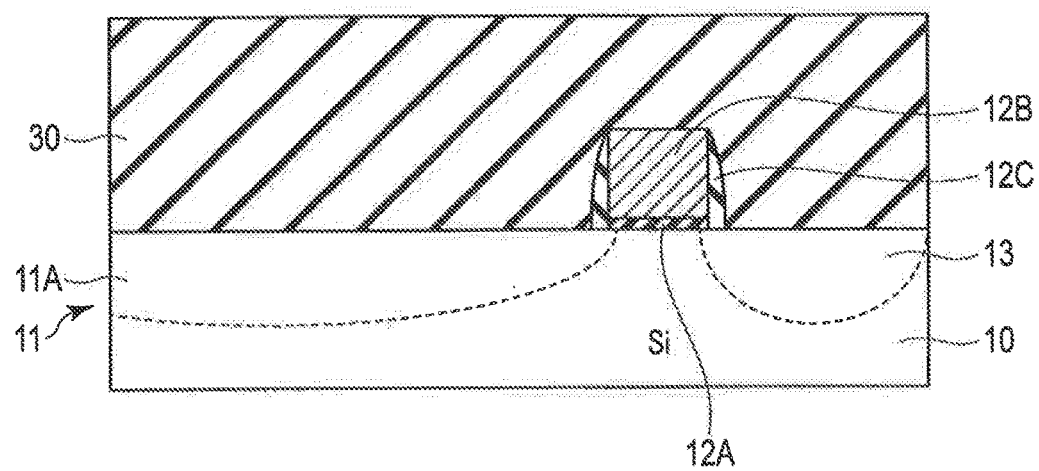
FIG. 5 is a sectional view illustrating the method for manufacturing a CMOS image sensor in the first embodiment.

Then, as depicted in FIG. 5, the interlayer insulating film 30 and a wiring layer (not depicted in the drawings) are formed on the transfer gate transistor 12, on the n-type diffusion layer 11A, on the floating diffusion 13, and on the silicon substrate 10. Moreover, although not depicted in the drawings, an $Al_2O_3$ layer may be formed on the interlayer insulating film 30 to a thickness of approximately 5 nm as an adhesive layer.

Then, the SiGeSn/Ge substrate 20 with the SiGeSn layer 20B stacked on the Ge substrate 20A is prepared. Moreover, as depicted in FIG. 1, the amplifier transistor 21, the select transistor 22, and the reset transistor 23 are formed on the SiGeSn/Ge substrate 20. The SiGeSn/Ge substrate 20 with these transistors formed thereon may be prepared in advance. Then, the silicon substrate 10 and the SiGeSn/Ge substrate 20 are laminated together. That is, the interlayer insulating film 30 on the silicon substrate 10 is laminated to the Ge substrate 20A in the SiGeSn/Ge substrate 20.

Subsequently, simultaneously with mesa isolation of the transistors, connection vias are formed which are used for connection to the wiring layers or electrodes on the silicon substrate 10. Moreover, a wiring layer is formed on the SiGeSn/Ge substrate 20 to electrically connect the floating diffusion 13, the amplifier transistor 21, and the reset transistor 23 together. Thus, the CMOS image sensor depicted in FIG. 1 is manufactured.

In the first embodiment, the electric signal resulting from a photoelectric conversion by the photodiode on the silicon substrate is amplified using the amplifier transistor that uses the heterojunction of the SiGeSn/Ge substrate as a channel, enabling a reduction in noise in readout signals, as described above. That is, a CMOS image sensor can be provided which enables a reduction in possible noise during readout.

Second Embodiment

A CMOS image sensor in a second embodiment will be described. In the second embodiment, an example will be explained in which an amplifier transistor on an SiGeSn/Ge substrate is used to amplify signals resulting from photoelectric conversions by a photodiode on a silicon substrate and a photodiode on the SiGeSn/Ge substrate.

Figure 6:
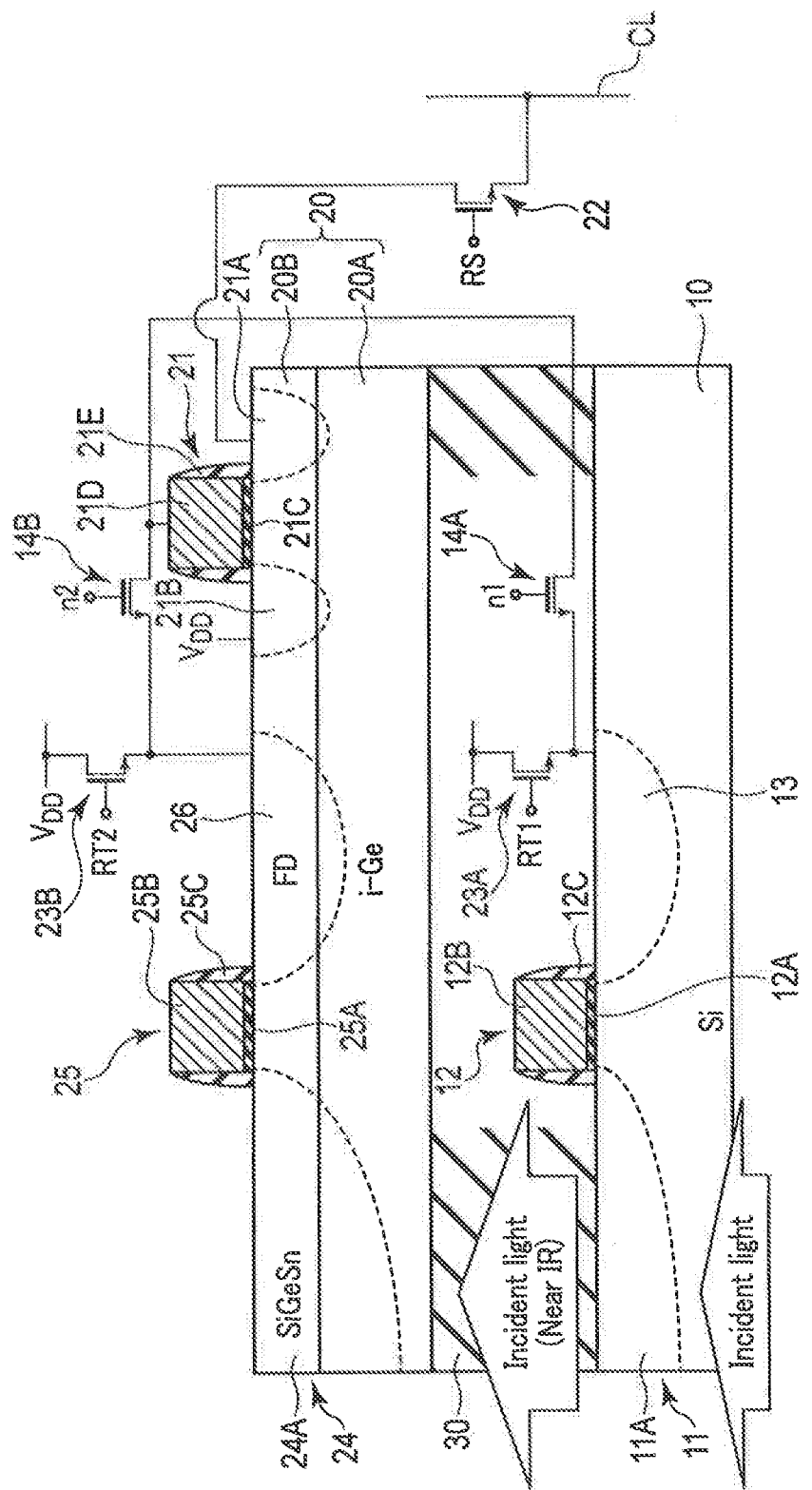
FIG. 6 is a sectional view depicting a configuration of a CMOS image sensor in a second embodiment.

FIG. 6 is a sectional view depicting the structure of the CMOS image sensor in the second embodiment.

As depicted in FIG. 6, the CMOS image sensor includes a photoelectric conversion element, for example, a photodiode 11, a transfer gate transistor 12, a floating diffusion 13, a reset transistor 23A, and a switching transistor 14A formed on a semiconductor substrate (for example, a p-type silicon substrate) 10, and a photoelectric conversion element, for example, a photodiode 24, a transfer gate transistor 25, a floating diffusion 26, an amplifier transistor 21, a reset transistor 23B, a switching transistor 14B, and a select transistor 22 formed on an SiGeSn/Ge substrate 20.

As is the case with the first embodiment, the photodiode 11 includes a p-type silicon substrate 10 and an n-type diffusion layer 11A, and converts light radiated through a back surface of the photodiode 11 into an electric signal to store the electric signal. The transfer gate transistor 12 controls transfer of the electric signal stored in the photodiode 11 to the floating diffusion 13.

The switching transistor 14A controls transfer of the electric signal stored in the floating diffusion 13 to the amplifier transistor 21. That is, the switching transistor 14A, when turned on, transfers the electric signal stored in the floating diffusion 13 to a gate insulating film 21D of the amplifier transistor 21. The reset transistor 23A resets the electric signal stored in the floating diffusion 13.

Furthermore, the photodiode 24 includes a p-type diffusion layer and an n-type diffusion layer 24A formed in the SiGeSn/Ge substrate 20, and is arranged immediately above the photodiode 11. That is, the photodiode 24 is arranged at a position corresponding to the photodiode 11 in a direction perpendicular to a front surface of the semiconductor substrate 10.

The photodiode 24 converts, into an electric signal, light (near infrared radiation) radiated through a second surface (or a back surface) opposite to a first surface (or a front surface) on which the transfer gate transistor 25 is arranged, and stores the electric signal. In other words, the photodiode 24 converts light radiated through the surface of the SiGeSn/Ge substrate 20 on which the silicon substrate 10 is arranged into an electric signal, and stores the electric signal.

The transfer gate transistor 25 controls transfer of the electric signal stored in the photodiode 24 to the floating diffusion 26. That is, the transfer gate transistor 25, when turned on, transfers the electric signal stored in the photodiode 24 to the floating diffusion 26. The floating diffusion 26 stores the electric signal transferred by the transfer gate transistor 25 in order to convert the electric signal into a capacity signal (voltage signal).

The switching transistor 14B controls transfer of the electric signal stored in the floating diffusion 26 to the amplifier transistor 21. That is, the switching transistor 14B, when turned on, transfers the electric signal stored in the floating diffusion 26 to the gate electrode 21D of the amplifier transistor 21. The reset transistor 23B resets the electric signal stored in the floating diffusion 26.

As is the case with the first embodiment, the amplifier transistor 21 has the heterojunction between the Ge substrate 20A and the SiGeSn layer 20B as a channel region. The amplifier transistor 21 is a source-follower-connected transistor that amplifies a signal according to the capacity signal stored in the floating diffusion 13 or 26. The select transistor 22 controls the output of the signal amplified by the amplifier transistor 21.

The structure of the CMOS image sensor in the second embodiment will be described below.

As depicted in FIG. 6, the n-type diffusion layer 11A, which forms the photodiode 11, and the floating diffusion 13 are formed in the silicon substrate 10. The gate insulating film 12A and the gate electrode 12B, which form the transfer gate transistor 12, are formed between the n-type diffusion layer 11A and the floating diffusion 13.

An interlayer insulating film 30 is formed on the transfer gate transistor 12 and the silicon substrate 10. The SiGeSn/

Ge substrate 20 is arranged on the interlayer insulating film 30. An $Al_2O_3$ layer may be formed between the interlayer insulating film 30 and the SiGeSn/Ge substrate 20 as an adhesive layer that facilitates adhesion between the interlayer insulating film 30 and the SiGeSn/Ge substrate 20.

Furthermore, the n-type diffusion layer 24A, which forms the photodiode 24, is formed in the SiGeSn layer 20B in the SiGeSn/Ge substrate 20. Moreover, the floating diffusion 26 is formed in the SiGeSn layer 20B so as to be spaced from the n-type diffusion layer 24A. The gate insulating film 25A and the gate electrode 25B, which form the transfer gate transistor 25, are formed on the SiGeSn layer 20B between the n-type diffusion layer 24A and the floating diffusion 26. More specifically, the gate insulating film 25A is formed on the SiGeSn layer 20B, and the gate electrode 25B is formed on the gate insulating film 25A. Moreover, sidewall insulating films 25C are formed on side surfaces of the gate electrode 25B. The n-type diffusion layer 24A and the floating diffusion 26 serve as a source region or a drain region for the transfer gate transistor 25.

The amplifier transistor 21 has the following structure. Diffusion layers 21A and 21B are formed in the SiGeSn layer 20B in the SiGeSn/Ge substrate 20 so as to be spaced from each other. A gate insulating film 21C is formed between the diffusion layers 21A and 21B, and a gate electrode 21D is formed on the gate insulating film 21C. Moreover, sidewall insulating films 21E are formed on side surfaces of the gate electrode 21D. The gate electrode 21D is electrically connected to the floating diffusion 13 via the switching transistor 14A. The gate electrode 21D is electrically connected to the floating diffusion 26 via the switching transistor 14B. Moreover, the diffusion layer 21B is electrically connected to the power supply voltage VDD.

A row select signal RS is supplied to a gate of the select transistor 22. Moreover, a source of the select transistor 22 is electrically connected to the diffusion layer 21A. A drain of the select transistor 22 is electrically connected to the column bus line CL.

A reset signal RT1 is supplied to a gate of the select transistor 23A. A source of the select transistor 23A is electrically connected to the power supply voltage VDD. A drain of the select transistor 23A is electrically connected to the floating diffusion 13. A reset signal RT2 is supplied to a gate of the select transistor 23B. A source of the select transistor 23B is electrically connected to the power supply voltage VDD. A drain of the select transistor 23B is electrically connected to the floating diffusion 26.

Operations of the CMOS image sensor in the second embodiment will be described.

Incident light radiated through the back surface of the silicon substrate 10 is received by the photodiode 11. The photodiode 11 converts the incident light into an electric signal as an image of a visible area of the incident light and stores the electric signal. The electric signal stored in the photodiode 11 is converted into a capacity signal by the floating diffusion 13. The capacity signal is supplied to the gate electrode 21D of the amplifier transistor 21 when the switching transistor 14A is turned on. The capacity signal is converted into a voltage signal by the amplifier transistor 21.

In this case, compared to Si-MOSFETs, the amplifier transistor 21 uses a channel comprising an interface (heterojunction) between the SiGeSn layer 20B and the Ge substrate 20A to enable noise to be reduced by one or more orders of magnitude, as is the case with the first embodiment. That is, the amplifier transistor 21 enables possible noise in the voltage signal to be reduced by one or more orders of magnitude compared to Si-MOSFETs.

Subsequently, the voltage signal amplified by the amplifier transistor 21 is output to the column bus line CL via the select transistor 22.

Furthermore, the incident light radiated through the back surface of the silicon substrate 10 reaches the back surface of the SiGeSn/Ge substrate 20 through the interlayer insulating film 30, and is then received by the photodiode 24. The photodiode 24 converts the incident light into an electric signal as an image of a visible area of the incident light and stores the electric signal. The electric signal stored in the photodiode 24 is converted into a capacity signal by the floating diffusion 26. The capacity signal is supplied to the gate electrode 21D of the amplifier transistor 21 when the switching transistor 14B is turned on. The capacity signal is converted into a voltage signal by the amplifier transistor 21.

In this case, compared to Si-MOSFETs, the amplifier transistor 21 uses the channel comprising the heterojunction between the SiGeSn layer 20B and the Ge substrate 20A to enable noise to be reduced by one or more orders of magnitude, as described above.

Subsequently, the voltage signal amplified by the amplifier transistor 21 is output to the column bus line CL via the select transistor 22.

In this manner, the photodiode 11 or 24 converts the incident light into the electric signal as an image signal of the visible area or an infrared area, and the amplifier transistor 21 is used to amplify the electric signal. This enables photon counting with readout noise of less than approximately 0.15 e⁻rms, and a significant increase in dynamic range. Moreover, images of the visible area and the infrared area can be collectively acquired.

The second embodiment includes a structure suitable for the back-illuminated CMOS image sensor in which light is radiated through the back surface of the semiconductor substrate 10 opposite to the front surface thereof on which the photodiode 11, the transistor 12, and the like are formed.

Next, a method for manufacturing a CMOS image sensor in the second embodiment will be described using FIGS. 6 to 8.

Figure 7:
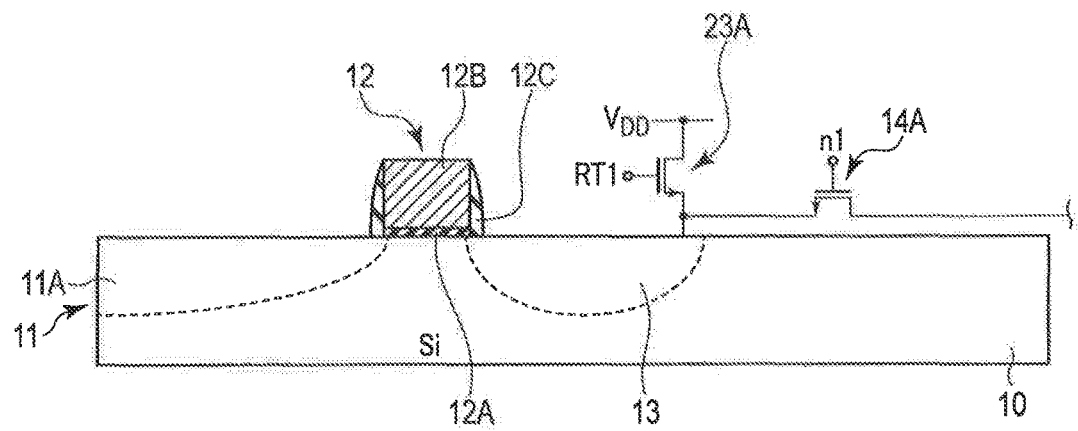
FIG. 7 is a sectional view illustrating a method for manufacturing a CMOS image sensor in a second embodiment.

First, as depicted in FIG. 7, the transfer gate transistor 12, the switching transistor 14A, and the reset transistor 23A are formed on the silicon substrate (for example, the p-type silicon substrate) 10. The transfer gate transistor 12 is formed as follows. The gate insulating film 12A and the gate electrode 12B are formed on the silicon substrate 10. Moreover, the sidewall insulating films 12C are formed on the side surfaces of the gate electrode 12B. Subsequently, the n-type diffusion layer 11A, which forms the photodiode 11, and the floating diffusion (n-type diffusion layer) 13 are formed in the silicon substrate 10 on the respective opposite sides of the gate electrode 12B. A description of a method for forming the switching transistor 14A and the reset transistor 23A is omitted.

Figure 8:
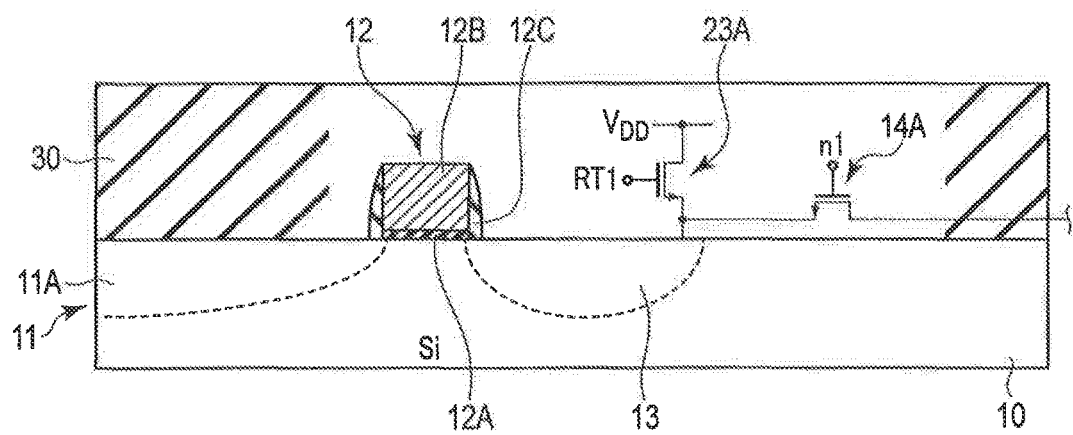
FIG. 8 is a sectional view illustrating the method for manufacturing a CMOS image sensor in the second embodiment.

Then, as depicted in FIG. 8, the interlayer insulating film 30 and a wiring layer (not depicted in the drawings) are formed on the transistors 12, 14A, and 23A, on the n-type diffusion layer 11A, on the floating diffusion 13, and on the silicon substrate 10. Moreover, although not depicted in the drawings, an $Al_2O_3$ layer may be formed on the interlayer insulating film 30 to a thickness of approximately 5 nm as an adhesive layer.

Then, the SiGeSn/Ge substrate 20 with the SiGeSn layer 20B stacked on the Ge substrate 20A is prepared. Moreover, as depicted in FIG. 6, the transfer gate transistor 25, the amplifier transistor 21, the select transistor 22, the switching transistor 14B, and the reset transistor 23B are formed on the SiGeSn/Ge substrate 20.

The transfer gate transistor 25 is formed as follows. The gate insulating film 25A and the gate electrode 25B are formed on the SiGeSn layer 20B in the SiGeSn/Ge substrate 20. Moreover, the sidewall insulating films 25C are formed on the side surfaces of the gate electrode 25B. Subsequently, the n-type diffusion layer 24A, which forms the photodiode 24, and the floating diffusion (n-type diffusion layer) 26 are formed in the SiGeSn/Ge substrate 20 on the respective opposite sides of the gate electrode 25B.

The amplifier transistor 21 is formed as follows. The gate insulating film 21C and the gate electrode 21D are formed on the SiGeSn layer 20B in the SiGeSn/Ge substrate 20. Moreover, sidewall insulating films 21E are formed on the side surfaces of the gate electrode 21D. Subsequently, the n-type diffusion layer 21A and 21B are formed in the SiGeSn/Ge substrate 20 on the respective opposite sides of the gate electrode 21D. A description of a method for forming the select transistor 22, the switching transistor 14B, and the reset transistor 23B is omitted. The SiGeSn/Ge substrate 20 with these transistors formed thereon may be prepared in advance.

Next, the silicon substrate 10 and the SiGeSn/Ge substrate 20 are laminated to each other. That is, the interlayer insulating film 30 on the silicon substrate 10 is laminated to the Ge substrate 20A in the SiGeSn/Ge substrate 20.

Subsequently, simultaneously with mesa isolation of the transistors, connection vias are formed which are used for connection to the wiring layers or electrodes on the silicon substrate 10. Moreover, a wiring layer is formed on the SiGeSn/Ge substrate 20 to electrically connect the floating diffusions 13 and 26 to the amplifier transistor 21 via the switching transistors 14A and 14B, respectively. Furthermore, the floating diffusions 13 and 26 are electrically connected to the reset transistors 23A and 23B, respectively. Thus, the CMOS image sensor depicted in FIG. 6 is manufactured.

As described above, in the second embodiment, the photodiode 11 on the silicon substrate or the photodiode 26 on the SiGeSn/Ge substrate 20 converts the incident light into the electric signal as an image signal of the visible area or the infrared area, and the amplifier transistor that uses the heterojunction of the SiGeSn/Ge substrate as a channel is used to amplify the electric signal. Thus, noise in readout signals can be reduced. That is, a CMOS image sensor can be provided which enables a reduction in possible noise during readout. Moreover, images of the visible area and the infrared area can be collectively acquired. The other configurations and effects are similar to the corresponding configurations and effects of the first embodiment.

Third Embodiment

A CMOS image sensor in a third embodiment will be described. In the first embodiment, the example has been described where the SiGeSn/Ge substrate is arranged on the surface of the silicon substrate on which the photodiode and the transistor are formed. In the third embodiment, an example will be described where the SiGeSn/Ge substrate is arranged on the surface of the silicon substrate opposite to the surface thereof on which the photodiode and the transistor are formed.

Figure 9:
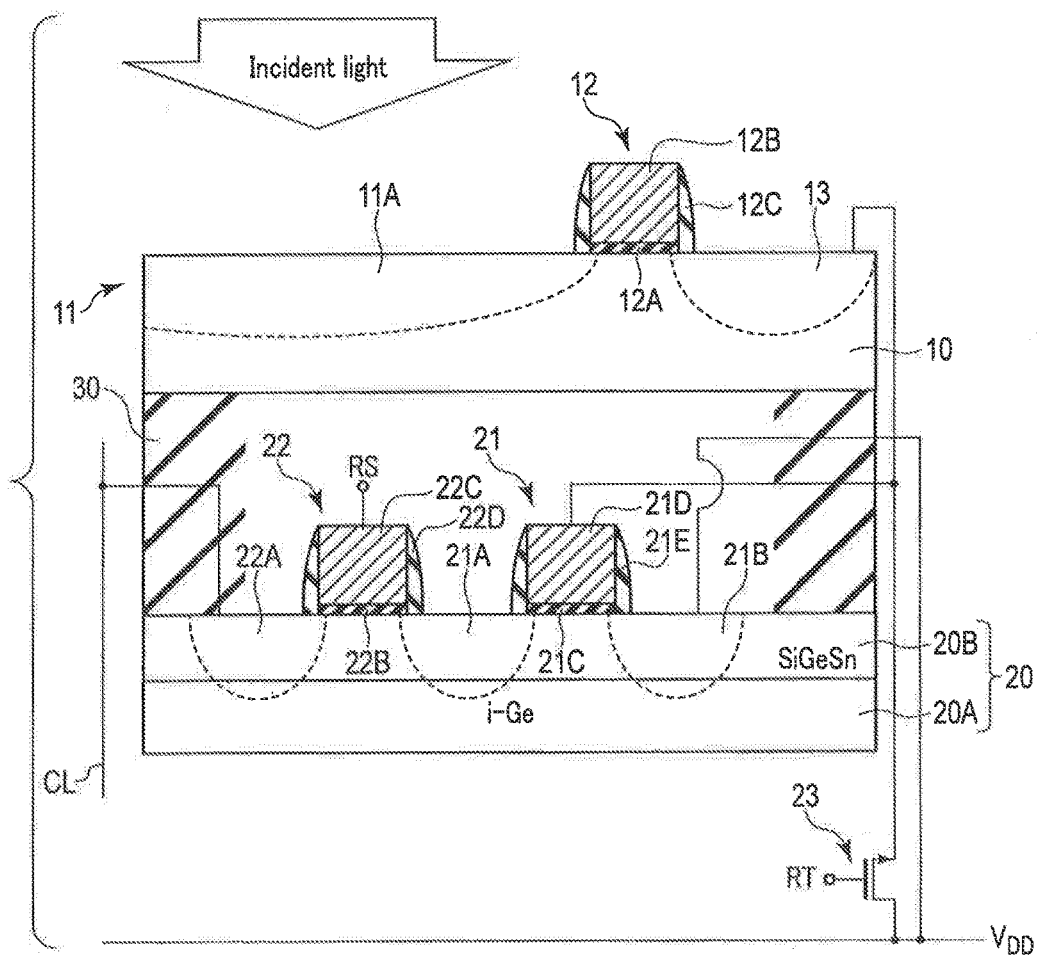
FIG. 9 is a sectional view depicting a configuration of a CMOS image sensor in a third embodiment.

FIG. 9 is a sectional view depicting the structure of the CMOS image sensor in the third embodiment.

As depicted in FIG. 9, a photodiode 11, a transfer gate transistor 12, and a floating diffusion 13 are formed on a first surface (or a front surface) of a semiconductor substrate 10. An SiGeSn/Ge substrate 20 is arranged, via an interlayer insulating film 30, on a second surface (or a back surface) of the semiconductor substrate 10 opposite to the first surface of thereof. An amplifier transistor 21, a select transistor 22, and a reset transistor 23 are formed on a first surface of the SiGeSn/Ge substrate 20. The second surface of the semiconductor substrate 10 is bonded to the first surface of the SiGeSn/Ge substrate 20 via the interlayer insulating film 30.

In other words, the semiconductor substrate 10 has the first surface and the opposite, second surface. The photodiode 11, the transfer gate transistor 12, and the floating diffusion 13 are formed on the first surface. The SiGeSn/Ge substrate 20 is arranged on the second surface of the semiconductor substrate 10.

In the third embodiment, light radiated through the first surface (or the front surface) of the semiconductor substrate 10 on which the photodiode 11 and the transfer gate transistor 12 are formed is converted into an electric signal. Then, a process similar to the corresponding process in the first embodiment is executed. That is, the third embodiment includes a structure suitable for a front-illuminated CMOS image sensor in which light is radiated through the front surface of the semiconductor substrate 10 on which the photodiode 11, the transistor 12, and the like are formed. The other configurations and effects are similar to the corresponding configurations and effects of the first embodiment.

The CMOS image sensor in the second embodiment may include a structure suitable for the front-illuminated CMOS image sensor in which light is radiated through the front surface of the semiconductor substrate 10 on which the photodiode 11, the transistor 12, etc. are formed.

FIG. 10 depicts a sectional view in which the CMOS image sensor in the second embodiment includes a structure suitable for the front-illuminated CMOS image sensor. The SiGeSn/Ge substrate 20 is arranged on the second surface (or the back surface) of the semiconductor substrate 10 opposite to the first surface thereof on which the photodiode 11 and the transfer gate transistor 12 are formed.

The photodiode 11 converts light radiated through the first surface (or the front surface) into an electric signal and stores the electric signal. Moreover, the photodiode 24 converts light (near infrared radiation) radiated through the first surface on which the transfer gate transistor 25 is arranged, and stores the electric signal. The other configurations and effects are similar to the corresponding configurations and effects of the second embodiment.

The several embodiments of the present invention have been described. However, the embodiments are presented as examples and are not intended to limit the scope of the invention. These novel embodiments can be implemented in various other manners, and a variety of omissions, replacements, and changes may be made to the embodiments. The embodiments and modifications thereof are included in the scope of the invention and the summary and also included in the invention recited in the claims and equivalents thereof.

What is claimed is:
1. A CMOS image sensor comprising:
   a photoelectric conversion element configured to convert incident light into an electric signal; and
   an amplifier transistor including a source and a drain provided in an SiGeSn layer stacked on a Ge layer, a gate insulating layer provided on the SiGeSn layer between the source and the drain, and a gate electrode provided on the gate insulating layer,
   wherein the amplifier transistor includes a heterojunction as a channel region and the heterojunction is provided on an interface between the SiGeSn layer and the Ge layer, and the amplifier transistor is configured to amplify the electric signal resulting from a conversion by the photoelectric conversion element.

2. The CMOS image sensor according to claim 1, wherein the amplifier transistor comprises a source-follower amplifier.

3. A CMOS image sensor comprising:

a first photoelectric conversion element provided in a first semiconductor substrate and configured to convert incident light into a first electric signal;

a first semiconductor layer provided in the first semiconductor substrate and configured to store the first electric signal resulting from a conversion by the first photoelectric conversion element;

a second semiconductor substrate with an SiGeSn layer stacked on a Ge substrate; and an amplifier transistor provided on the second semiconductor substrate comprising:

a source and a drain provided in the SiGeSn layer, a gate insulating layer provided on the SiGeSn layer between the source and the drain, and a gate electrode provided on the gate insulating layer, wherein the amplifier transistor includes a heterojunction as a channel region, the heterojunction being provided on an interface between the SiGeSn layer and the Ge substrate, and the amplifier transistor is configured to amplify the first electric signal stored in the first semiconductor layer.

4. The CMOS image sensor according to claim 3, wherein the first semiconductor substrate has a first surface and a second surface opposite to the first surface, the first photoelectric conversion element and the first semiconductor layer are provided on the first surface, and the second semiconductor substrate is opposed to the first surface.

5. The CMOS image sensor according to claim 3, wherein the first semiconductor substrate has a first surface and a second surface opposite to the first surface, the first photoelectric conversion element and the first semiconductor layer are provided on the first surface, and the second semiconductor substrate is opposed to the second surface.

6. The CMOS image sensor according to claim 3, further comprising a transfer transistor provided on the first semiconductor substrate and configured to transfer the first electric signal from the first photoelectric conversion element to the first semiconductor layer.

7. The CMOS image sensor according to claim 3, further comprising:

a reset transistor provided on the first semiconductor substrate and configured to reset the first electric signal stored in the first semiconductor layer; and a select transistor configured to control output of the first electric signal amplified by the amplifier transistor.

8. The CMOS image sensor according to claim 3, further comprising:

a second photoelectric conversion element provided in the second semiconductor substrate and configured to convert the incident light into a second electric signal; and a second semiconductor layer provided in the second semiconductor substrate and configured to store the second electric signal resulting from conversion by the second photoelectric conversion element, wherein the amplifier transistor amplifies the first and second electric signals stored in the first and second semiconductor layers.

9. The CMOS image sensor according to claim 8, further comprising:

a first transfer transistor provided on the first semiconductor substrate and configured to transfer the first electric signal from the first photoelectric conversion element to the first semiconductor layer; and a second transfer transistor provided on the second semiconductor substrate and configured to transfer the second electric signal from the second photoelectric conversion element to the second semiconductor layer.

10. The CMOS image sensor according to claim 8, further comprising:

a first reset transistor provided on the first semiconductor substrate and configured to reset the first electric signal stored in the first semiconductor layer;

a first switching transistor provided on the first semiconductor substrate and configured to control output of the first electric signal stored in the first semiconductor layer to the amplifier transistor;

a second reset transistor provided on the second semiconductor substrate and configured to reset the second electric signal stored in the second semiconductor layer; and a second switching transistor provided on the second semiconductor substrate and configured to control output of the second electric signal stored in the second semiconductor layer to the amplifier transistor.

* * * * *